(12) United States Patent
Han

(10) Patent No.: US 11,271,531 B2
(45) Date of Patent: Mar. 8, 2022

(54) POWER AMPLIFIER MODULE

(71) Applicant: Samsung Electro-Mechanics Co., Ltd., Suwon-si (KR)

(72) Inventor: Su Yeon Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 108 days.

(21) Appl. No.: 16/855,408

(22) Filed: Apr. 22, 2020

(65) Prior Publication Data

US 2021/0194442 A1    Jun. 24, 2021

(30) Foreign Application Priority Data

Dec. 23, 2019 (KR) .......................... 10-2019-0172976

(51) Int. Cl.
*H03F 3/04* (2006.01)
*H03F 3/21* (2006.01)
*H03F 1/02* (2006.01)
*H03F 1/30* (2006.01)
*H03F 1/56* (2006.01)

(52) U.S. Cl.
CPC ............. *H03F 3/21* (2013.01); *H03F 1/0233* (2013.01); *H03F 1/302* (2013.01); *H03F 1/56* (2013.01); *H03F 2200/447* (2013.01); *H03F 2200/451* (2013.01)

(58) Field of Classification Search
CPC ......... H03F 1/302; H03F 3/04; H03F 2200/447
USPC .................................. 330/285, 289, 296
See application file for complete search history.

(56) References Cited

U.S. PATENT DOCUMENTS

| 9,698,853 | B2 | 7/2017 | Andrys et al. |
| 2011/0043287 | A1* | 2/2011 | Chen ..................... H03F 3/195 |
| | | | 330/296 |
| 2018/0262165 | A1 | 9/2018 | Ishihara et al. |

FOREIGN PATENT DOCUMENTS

| KR | 10-2006-0076516 A | 7/2006 |
| KR | 10-2018-0104549 A | 9/2018 |

* cited by examiner

*Primary Examiner* — Steven J Mottola
(74) *Attorney, Agent, or Firm* — NSIP Law

(57) ABSTRACT

A power amplifier module includes a power amplifier including an amplifying unit including an amplifying transistor configured to amplify an input signal and output an output signal, and a bias unit including a bias transistor configured to provide a bias current to the amplifying transistor, and a sub bias transistor configured to provide a sub bias current to the amplifying transistor; and a control unit configured to provide a control current to the bias transistor and the sub bias transistor. The control unit is further configured to vary the control current according to the sub bias current, and a level of the sub bias current is lower than a level of the bias current.

16 Claims, 4 Drawing Sheets

POWER AMPLIFIER MODULE

CROSS-REFERENCE TO RELATED APPLICATIONS

This application claims the benefit under 35 USC 119(a) of Korean Patent Application No. 102019-0172976 filed on Dec. 23, 2019, in the Korean Intellectual Property Office, the entire disclosure of which is incorporated herein by reference for all purposes.

BACKGROUND

1. Field

This application relates to a power amplifier module.

2. Description of Related Art

Mobile communication terminals such as cellular phones employ a power amplifier module for amplifying a radio-frequency (RF) signal to be transmitted to a base station. The power amplifier module includes an amplifier for amplifying an RF signal, and a bias circuit for controlling a bias point of the amplifier.

However, when a voltage of the amplified RF signal exceeds a withstand voltage of an antenna switch due to a change in a load impedance connected to an output terminal of the amplifier, a change in a battery voltage, or some other reason, a power of the amplified RF signal may drop due to a current leakage of a field-effect transistor constituting the antenna switch.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power amplifier module includes a power amplifier including an amplifying unit including an amplifying transistor configured to amplify an input signal and output an output signal, and a bias unit including a bias transistor configured to provide a bias current to the amplifying transistor, and a sub bias transistor configured to provide a sub bias current to the amplifying transistor; and a control unit configured to provide a control current to the bias transistor and the sub bias transistor, wherein the control unit may be further configured to vary the control current according to the sub bias current, and a level of the sub bias current is lower than a level of the bias current.

The control unit may include a detection voltage output unit including a detection resistor disposed in a path of the sub bias current so that the sub bias current flows through the detection resistor and generates a detection voltage between two ends of the detection resistor, and the control unit may be further configured to output the detection voltage generated between the two ends of the detection resistor.

The detection resistor may be connected between the sub bias transistor and a driving voltage terminal configured to provide a driving voltage to the sub bias transistor.

The control unit may further include a current level determination unit configured to determine the level of the sub bias current according to a level of the detection voltage.

The current level determination unit may store data including levels of the detection voltage and corresponding levels of the sub bias current, and may be further configured to determine the level of the sub bias current corresponding to the level of the detection voltage by referring to the data.

The control unit may further include a control current generation unit configured to generate the control current according to the level of the sub bias current.

The bias unit may include a diode configured to generate a temperature compensation voltage according to the control current.

The diode may include a diode-connected transistor including a collector and a base connected to each other.

In another general aspect, a power amplifier module includes a power amplifier including an amplifying unit including an amplifying transistor configured to amplify an input signal and output an output signal, and a bias unit including a bias transistor configured to receive a first driving voltage and provide a bias current to the amplifying transistor, and a sub bias transistor configured to receive a second driving voltage and provide a sub bias current to the amplifying transistor; and a control unit configured to provide a control current to the bias transistor and the sub bias transistor, wherein the control unit may be further configured to vary the control current according to the sub bias current, and a level of the second driving voltage provided to the sub bias transistor is lower than a level of the first driving voltage provided to the bias transistor.

The control unit may include a detection voltage output unit including a detection resistor disposed in a path of the sub bias current so that the sub bias current flows through the detection resistor and generates a detection voltage between two ends of the detection resistor, and the control unit may be further configured to output the detection voltage generated between the two ends of the detection resistor.

The detection resistor may be connected between the sub bias transistor and a second driving voltage terminal configured to provide the second driving voltage to the sub bias transistor.

The control unit may further include a current level determination unit configured to determine the level of the sub bias current according to a level of the detection voltage.

The current level determination unit may store data including levels of the detection voltage and corresponding levels of the sub bias current, and may be further configured to determine the level of the sub bias current corresponding to the level of the detection voltage by referring to the data.

The control unit may further include a control current generation unit configured to generate the control current according to the level of the sub bias current.

The bias unit may include a diode configured to generate a temperature compensation voltage according to the control current.

The diode may include a diode-connected transistor including a collector and a base connected to each other.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
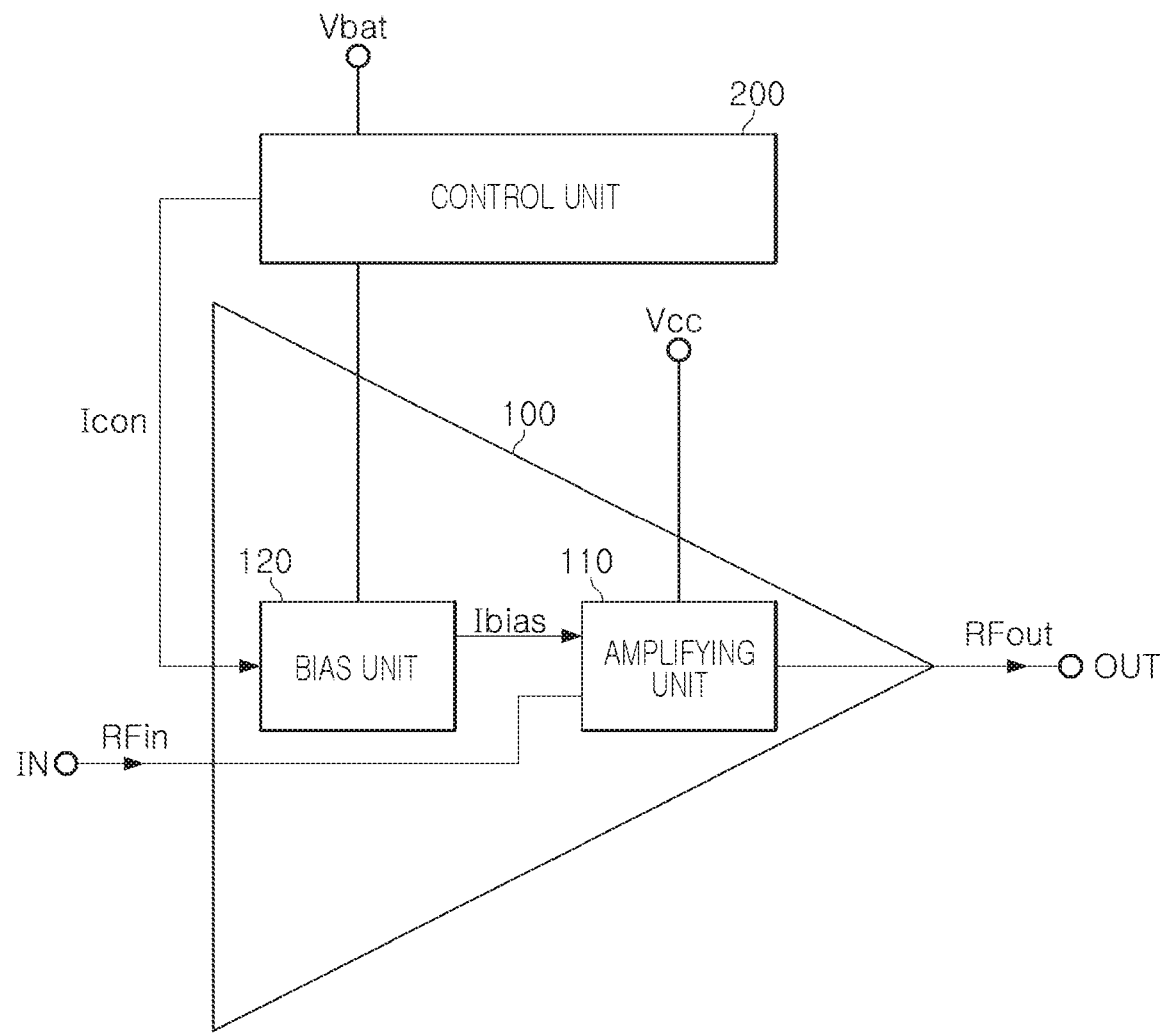
FIG. 1 is a block diagram of an example of a power amplifier module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when one element is described as being "connected to" or "coupled to" another element, the one element may be directly "connected to" or "coupled to" the other element, or there may be one or more other elements intervening therebetween. In contrast, when one element is described as being "directly connected to" or "directly coupled to" another element, there can be no other element intervening therebetween.

As used herein, the term "and/or" includes any one and any combination of any two or more of the associated listed items.

Although terms such as "first," "second," and "third" may be used herein to describe various elements, these elements are not to be limited by these terms. Rather, these terms are only used to distinguish one element from another element. Thus, a first element referred to in examples described herein may also be referred to as a second element without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is block diagram of an example of a power amplifier module.

Referring to FIG. 1, a power amplifier module 10 includes a power amplifier 100 and a control unit 200.

The power amplifier 100 may amplify an input signal RFin input through an input terminal IN according to a control current Icon to generate an output signal RFout, and may output the generated output signal RFout through an output terminal OUT.

For example, the power amplifier 100 may output the output signal RFout by amplifying a power of the input signal RFin to a level necessary for transmitting the power to a base station. The output terminal OUT of the power amplifier 100 may be connected to an antenna, and the output signal RFout may be transmitted from the antenna.

The power amplifier 100 may be driven by receiving a first driving voltage Vcc and a second driving voltage Vbat from respective terminals. Hereinafter, for convenience of description, the terminals supplying the first driving voltage Vcc and the second driving voltage Vbat are referred to as a first driving voltage (Vcc) terminal and a second driving voltage (Vbat) terminal, respectively.

The power amplifier 100 may include an amplifying unit 110 for amplifying an input signal RFin, and a bias unit 120 for generating a bias current Ibias according to the control current Icon provided from the control unit 200, and providing the generated bias current Ibias to the amplifying unit 110. The amplifying unit 110 may be connected to the first driving voltage (Vcc) terminal, and the bias unit 120 may be connected to the second driving voltage (Vbat) terminal via the control unit 200.

In FIG. 1, it is illustrated that the power amplifier 100 includes one amplifying unit 110, but in other examples, the power amplifier 100 may include a plurality of amplifying units 110 connected in series with each other, and the plurality of amplifying units 110 connected in series may sequentially amplify the input signal RFin to generate the output signal RFout. A respective matching circuit may be connected between adjacent amplifying units 110 among the plurality of amplifying units 110 connected in series to match an output impedance of a first one of the adjacent amplifying units 110 to an input impedance of a second one of the adjacent amplifying units 110. For example, if a first amplifying unit 110, a second amplifying unit 110, and a third amplifying unit 110 are connected in series with each other, a first matching circuit may be connected between an output of the first amplifying unit 110 and an input of the second amplifying unit 110, and a second matching circuit may be connected between an output of the second amplifying unit 110 and an input of the third amplifying unit 110.

A baseband integrated circuit (IC) for generating a baseband signal and an RF IC for modulating the baseband signal into an input signal RFin may be connected to the input terminal IN of the power amplifier 100. The baseband IC encodes and modulates communication information according to a predetermined communication method, and generates a baseband signal by digital signal processing. The RF IC modulates a carrier according to information superimposed on the baseband signal to generate the input signal RFin.

The control unit 200 may provide a control current Icon to the power amplifier 100. The control unit 200 may vary the control current Icon provided to the power amplifier 100 according to the bias current Ibias.

Figure 2:
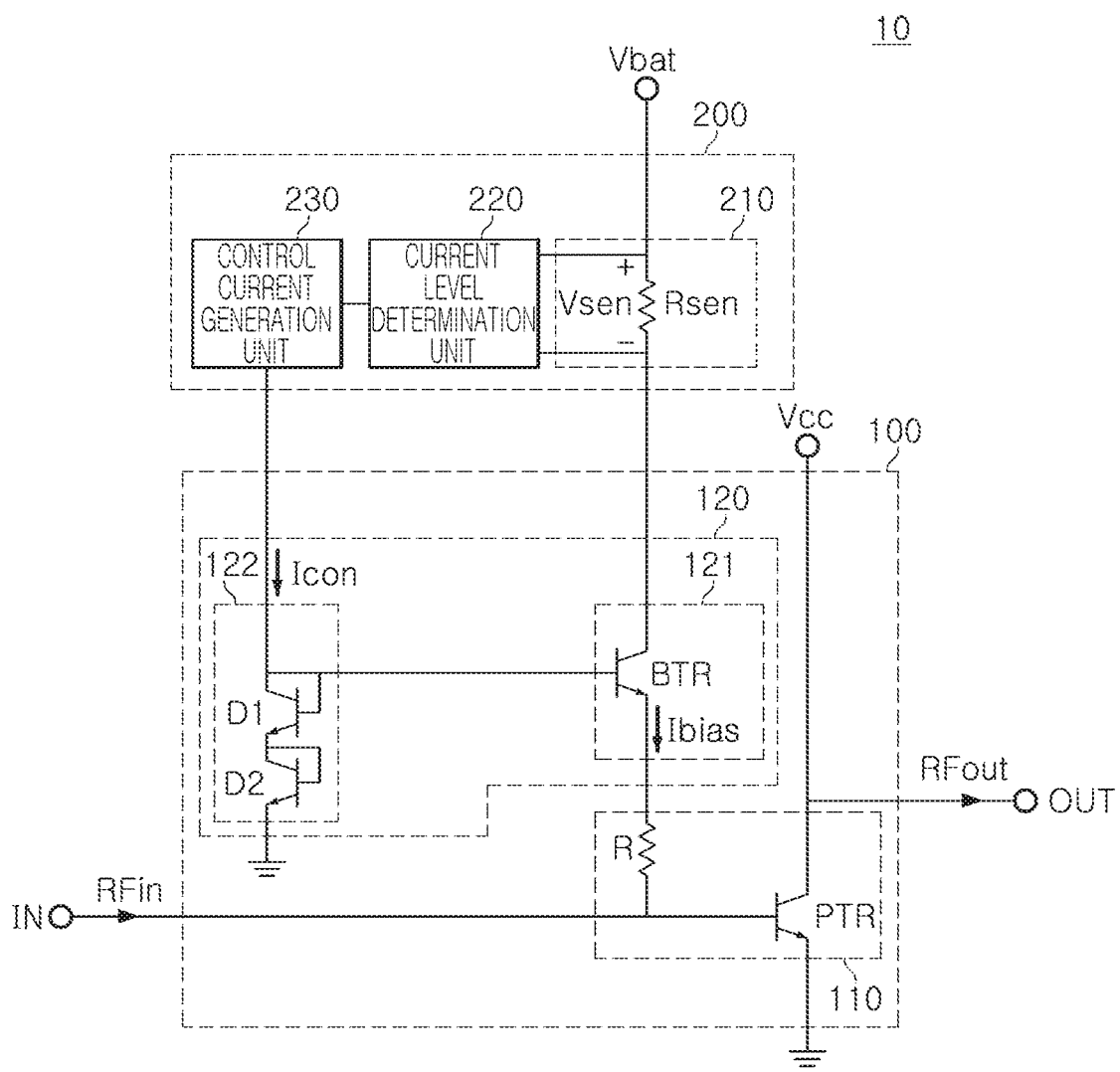
FIG. 2 is a circuit diagram illustrating in detail the power amplifier module of FIG. 1.

FIG. 2 is a circuit diagram illustrating in detail the power amplifier module of FIG. 1.

Referring to FIG. 2, a power amplifier 100 includes an amplifying unit 110 and a bias unit 120.

The amplifying unit 100 may amplify an input signal RFin through an input terminal IN according to a bias current Ibias provided from the bias unit 120 to generate an output signal RFout, and may output the generated output signal RFout through an output terminal OUT.

The amplifying unit 110 may include an amplifying transistor PTR having an emitter connected to a ground. A base of the amplifying transistor PTR is connected to the input terminal IN, and the input signal RFin is input to the base of the amplifying transistor PTR. In other examples, the base of the amplifying transistor PTR may be connected to the input terminal IN through a capacitor.

In addition, the base of the amplifying transistor PTR may be connected to an emitter of a bias transistor BTR so that the bias current Ibias may be input to the base of the amplifying transistor PTR. The base of the amplifying transistor PTR may be connected to the emitter of the bias transistor BTR through a ballast resistor R.

A collector of the amplifying transistor PTR is connected to the output terminal OUT, and outputs the output signal RFout through the output terminal OUT. In another example, the collector of the amplifying transistor PTR may be connected to the output terminal OUT through a capacitor.

In addition, the collector of the amplifying transistor PTR is connected to a first driving voltage (Vcc) terminal. In another example, the collector of the amplifying transistor PTR is connected to the first driving voltage (Vcc) terminal through an inductor.

The amplifying transistor PTR may amplify the input signal RFin input through the input terminal IN according to the bias current Ibias, and may output the output signal RFout through the output terminal OUT.

A bias unit 120 may include a bias current generation unit 121 and a temperature compensation unit 122.

The bias current generation unit 121 may generate the bias current Ibias according to the control current Icon provided from the control unit 200, and provide the generated bias current Ibias to the amplifying unit 110.

The bias current generation unit 121 may include the bias transistor BTR for generating the bias current Ibias according to the control current Icon.

A base of the bias transistor BTR is connected to the control unit 200 via the temperature compensation unit 122, and the control current Icon is input to the base of the bias transistor BTR via the temperature compensation unit 122.

A collector of the bias transistor BTR is connected to the second driving voltage (Vbat) terminal via the control unit 200.

The emitter of the bias transistor BTR may be connected to the base of the amplifying transistor PTR through the ballast resistor R to provide the bias current Ibias to the base of the amplifying transistor PTR.

When the amplifying transistor PTR is driven so that a voltage between the base of the amplifying transistor PTR and the emitter of the amplifying transistor PTR is constant, a collector current of the amplifying transistor PTR increases as a temperature of the amplifying transistor PTR increases. The increase in the collector current increases a power consumption of the amplifying transistor PTR, which further increases the temperature of the amplifying transistor PTR, which further increases the collector current, thereby causing a thermal runaway phenomenon in which the collector current continues to increase.

To prevent the thermal runaway phenomenon described above, the temperature compensation unit 122 may be connected between the base of the bias transistor BTR and a ground.

The temperature compensation unit 122 may include diodes D1 and D2 connected in series with each other. The two diodes D1 and D2 of the temperature compensation unit 122 generate a temperature compensation voltage according to the control current Icon provided from the control unit 200. In other examples, the temperature compensation unit 122 may include one diode, or more than two diodes. Thus, in general, the temperature compensation unit 122 may include at least one diode.

The temperature compensation voltage of the two diodes D1 and D2 falls as the temperature increases, causing the base voltage of the bias transistor BTR to fall as the temperature increases. As a result, thermal runaway of the amplifying transistor PTR can be prevented.

Each of the at least one diode D1 and D2 may be implemented by a diode-connected transistor. Each of the diode-connected transistors has a collector and a base connected to each other.

When a voltage of the output signal RFout exceeds a withstand voltage of an antenna switch due to a change in a load impedance connected to the output terminal OUT, a change in a battery voltage, or other reason, a power of the output signal RFout may drop due to a current leakage of a field-effect transistor constituting the antenna switch, and the antenna switch may be burned out by the output signal RFout exceeding the withstand voltage of the antenna switch.

The control unit 200 may detect the bias current Ibias, and vary the control current Icon according to the detected bias current Ibias to limit the output of the power amplifier 100.

Referring to FIG. 2, the control unit 200 includes a detection voltage output unit 210, a current level determination unit 220, and a control current generation unit 230.

The detection voltage output unit 210 may include a detection resistor Rsen disposed in a path of the bias current Ibias. The detection resistor Rsen may be connected between the second driving voltage (Vbat) terminal and the collector of the bias transistor BTR.

When the bias transistor BTR is turned on, the bias current Ibias flows from the second driving voltage (Vbat) terminal through the detection resistor Rsen to the collector of the bias transistor BTR, thereby generating a detection voltage Vsen between the two ends of the detection resistor Rsen.

The detection voltage output unit 210 may output the detection voltage Vsen generated between the two ends of the detection resistor Rsen by the bias current Ibias flowing through the detection resistor Rsen.

The current level determination unit 220 may determine a level of the bias current Ibias according to the detection voltage Vsen. For example, the current level determination unit 220 may store data including levels of the detection voltage Vsen and corresponding levels of the bias current Ibias, and may determine the level of the bias current Ibias corresponding to the level of the detection voltage Vsen by referring to the data. For example, the current level determination unit 220 may include a look-up table storing the data, and may determine the level of the bias current Ibias corresponding to the level of the detection voltage Vsen by applying the detection voltage Vsen to the look-up table and retrieving the corresponding level of the bias current Ibias from the look-up table.

The control current generation unit 230 may generate a control current Icon according to the level of the bias current Ibias determined by the current level determination unit 220. For example, the control current generation unit 230 may vary the level of the control current Icon in response to a change in the level of the bias current Ibias. According to the control current Icon generated by the control current generation unit 230, the bias current Ibias may be changed to limit the output of the power amplifier 100.

Although the power amplifier module 10 may vary the control current Icon according to the bias current Ibias to limit the output of the power amplifier 100, there is a problem in which an amplification efficiency of the power amplifier 100 is deteriorated due to a voltage drop of the second driving voltage Vbat caused by the detection resistor Rsen.

Figure 3:
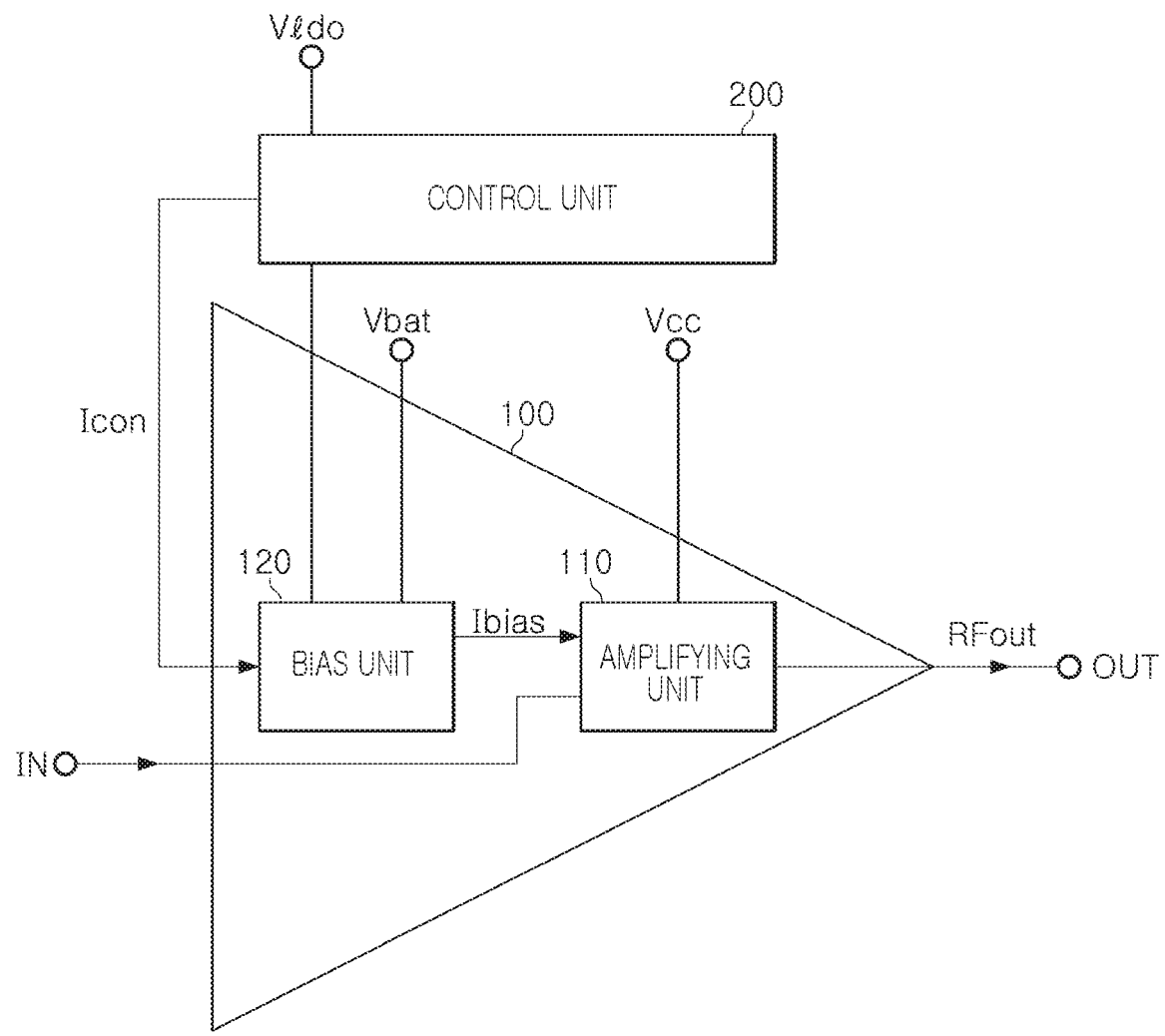
FIG. 3 is a block diagram of another example of a power amplifier module.
Figure 4:
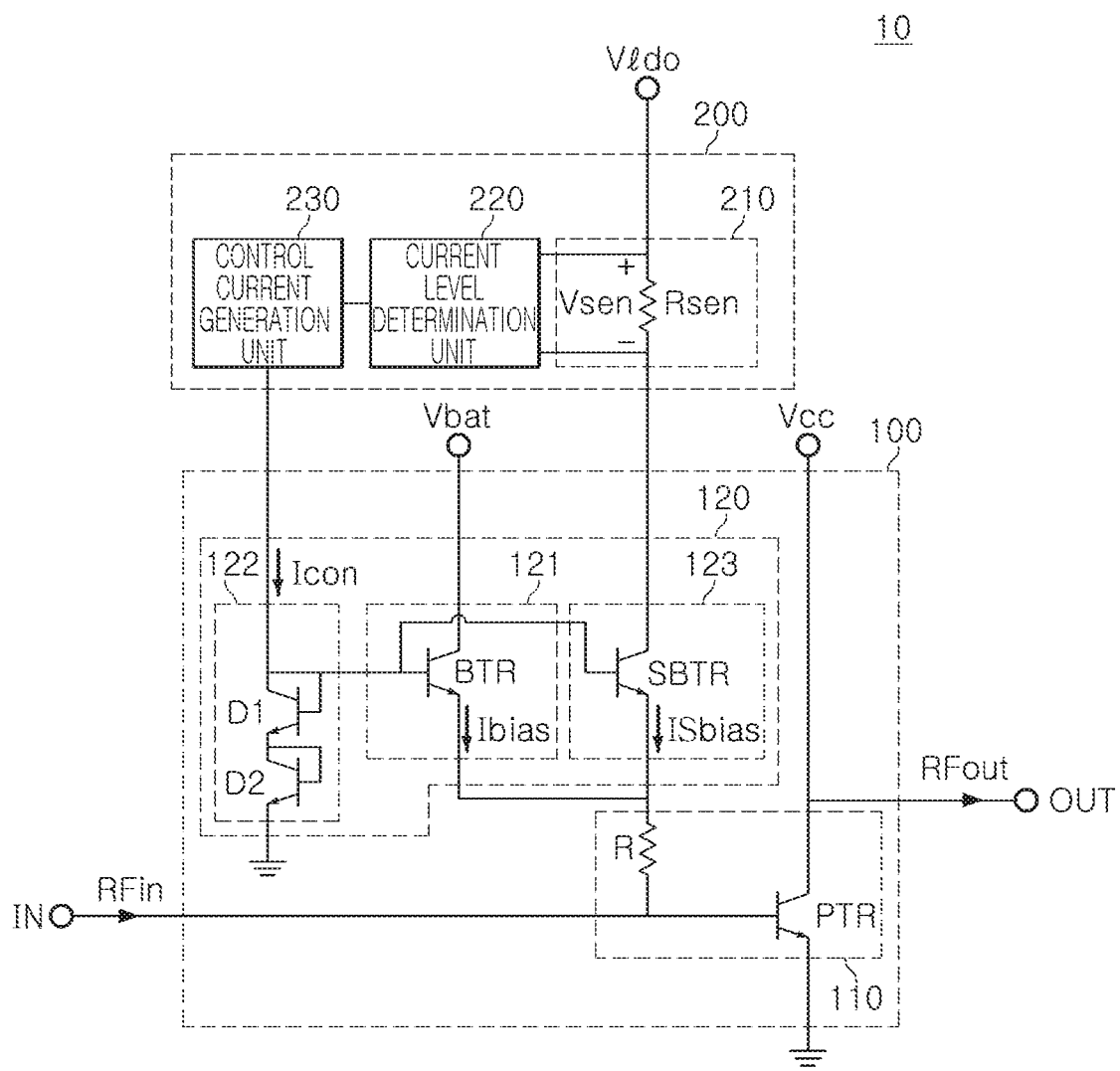
FIG. 4 is a circuit diagram illustrating in detail the power amplifier module of FIG. 3.

FIG. 3 is a block diagram of another example of a power amplifier module, and FIG. 4 is a circuit diagram illustrating in detail the power amplifier module of FIG. 3.

Since the power amplifier module of FIGS. 3 and 4 is similar to the power amplifier module of FIGS. 1 and 2, redundant descriptions will be omitted and only descriptions of differences will be provided.

Referring to FIG. 3, a power amplifier module 10 includes a power amplifier 100 and a control unit 200.

The power amplifier 100 may amplify an input signal RFin input through an input terminal IN according to a control current Icon to generate an output signal RFout, and may output the generated output signal RFout through an output terminal OUT.

For example, the power amplifier 100 may amplify a power of the input signal RFin to a level necessary for transmitting the power to a base station. The output terminal OUT of the power amplifier 100 may be connected to an antenna, and the output signal RFout may be transmitted from the antenna.

The power amplifier 100 may be driven by receiving a first driving voltage Vcc, a second driving voltage Vbat, and a third driving voltage Vldo from respective terminals. Hereinafter, for convenience of description, the terminals supplying the first driving voltage Vcc, the second driving voltage Vbat, and the third driving voltage Vldo are referred to as a first driving voltage (Vcc) terminal, a second driving voltage (Vbat) terminal, and a third driving voltage (Vldo) terminal, respectively.

The power amplifier 100 may include an amplifying unit 110 for amplifying an input signal RFin, and a bias unit 120 for generating a bias current Ibias according to the control current Icon provided from the control unit 200, and providing the generated bias current Ibias to the amplifying unit 110. The amplifying unit 110 may be connected to the first driving voltage (Vcc) terminal, and the bias unit 120 may be connected to the second driving voltage (Vbat) terminal via the control unit 200, and to the third driving voltage (Vldo) terminal.

In FIG. 3, it is illustrated that the power amplifier 100 includes one amplifying unit 110, but in other examples, the power amplifier 100 may include a plurality of amplifying units 110 connected in series with each other, and the plurality of amplifying units 110 connected in series may sequentially amplify the input signal RFin to generate the output signal RFout. A respective matching circuit may be connected between adjacent amplifying units 110 among the plurality of amplifying units 110 connected in series to match an output impedance of a first one of the adjacent amplifying units 110 to an input impedance of a second one of the adjacent amplifying units 110. For example, if a first amplifying unit 110, a second amplifying unit 110, and a third amplifying unit 110 are connected in series with each other, a first matching circuit may be connected between an output of the first amplifying unit 110 and an input of the second amplifying unit 110, and a second matching circuit may be connected between an output of the second amplifying unit 110 and an input of the third amplifying unit 110.

The control unit 200 may provide a control current Icon to the power amplifier 100. The control unit 200 may vary the control current Icon provided to the power amplifier 100 according to a sub bias current ISbias shown in FIG. 4.

Referring to FIG. 4, a power amplifier 100 includes an amplifying unit 110 and a bias unit 120.

The amplifying unit 110 may amplify an input signal RFin input through an input terminal IN according to a bias current Ibias and a sub bias current ISbias provided from the bias unit 120 to generate an output signal RFout, and may output the generated output signal RFout through an output terminal OUT.

The amplifying unit 110 may include an amplifying transistor PTR having an emitter connected to a ground. A base of the amplifying transistor PTR is connected to the input terminal IN, and the input signal RFin is input to the base of the amplifying transistor PTR. In other examples, the base of the amplifying transistor PTR may be connected to the input terminal IN through a capacitor.

In addition, the base of the amplifying transistor PTR may be connected to an emitter of a bias transistor BTR and an emitter of a sub bias transistor SBTR so that the bias current Ibias and the sub bias current ISbias may be input to the base of the amplifying transistor PTR. The base of the amplifying transistor PTR may be connected to the emitter of the bias transistor BTR and the emitter of the sub bias transistor SBTR through a ballast resistor R.

A collector of the amplifying transistor PTR is connected to the output terminal OUT, outputs the output signal RFout through the output terminal OUT. In another example, the collector of the amplifying transistor PTR may be connected to the output terminal OUT through a capacitor.

In addition, the collector of the amplifying transistor PTR is connected to a first driving voltage (Vcc) terminal. In another example, the collector of the amplifying transistor PTR is connected to the first driving voltage (Vcc) terminal through an inductor.

The amplifying transistor PTR may amplify the input signal RFin input through the input terminal IN according to the bias current Ibias and the sub bias current ISbias, and may output the output signal RFout through the output terminal OUT.

The bias unit 120 may include a bias current generation unit 121, a temperature compensation unit 122, and a sub bias current generation unit 123.

The bias current generation unit 121 may generate the bias current Ibias according to the control current Icon provided form the control unit 200, and may provide the generated bias current Ibias to the amplifying unit 110.

The bias current generation unit 121 may include the bias transistor BTR for generating the bias current Ibias according to the control current Icon.

A base of the bias transistor BTR is connected to the control unit 200 via the temperature compensation unit 122, and the control current Icon is input to the base of the bias transistor BTR via the temperature compensation unit 122.

A collector of the bias transistor BTR is connected to the second driving voltage (Vbat) terminal.

An emitter of the bias transistor BTR may be connected to the base of the amplifying transistor PTR through the ballast resistor R to provide the bias current Ibias to the base of the amplifying transistor PTR.

The sub bias current generation unit 123 may generate the sub bias current ISbias according to the control current Icon provided from the control unit 200, and may provide the generated sub bias current ISbias to the amplifying unit 110.

The sub bias current generation unit 123 may include the sub bias transistor SBTR for generating the sub bias current ISbias according to the control current Icon.

A base of the sub bias transistor SBTR is connected to the control unit 200 via the temperature compensation unit 122, and the control current Icon is input to the base of the sub bias transistor SBTR.

A collector of the sub bias transistor SBTR is connected to the third driving voltage (Vldo) terminal via the control unit 200.

An emitter of the sub bias transistor SBTR may be connected to the base of the amplifying transistor PTR through the ballast resistor R to provide the sub bias current ISbias to the base of the amplifying transistor PTR.

The temperature compensation unit 122 may be connected between the base of the bias transistor BTR and a ground. The base of the sub bias transistor SBTR may be connected to the base of the bias transistor BTR so that the temperature compensation unit 122 also may be connected between the base of the sub bias transistor SBTR and the ground.

The temperature compensation unit 122 may include two diodes D1 and D2 connected in series with each other. The two diodes D1 and D2 of the temperature compensation unit 122 generate a temperature compensation voltage according to the control current Icon provided from the control unit 200. In other examples, the temperature compensation unit 122 may include one diode, or more than two diodes. Thus, in general, the temperature compensation unit 122 may include at least one diode.

The temperature compensation voltage of the two diodes D1 and D2 falls as the temperature increases, causing a base voltage of the bias transistor BTR and a base voltage of the sub bias transistor SBTR to fall as the temperature increases. As a result, thermal runaway of the amplifying transistor PTR may be prevented.

Each of the two diodes D1 and D2 may be implemented by a diode-connected transistor. Each of the diode-connected transistors has a collector and a base connected to each other.

The control unit 200 may detect the sub bias current ISbias, and vary the control current Icon according to the detected sub bias current ISbias to limit the output of the power amplifier 100.

The control unit 200 of the example of FIGS. 1 and 2 detects the bias current Ibias, and varies the control current Icon according to the detected bias current Ibias, whereas the control unit 200 of the example of FIGS. 3 and 4 detects the sub bias current ISbias, and varies the control current Icon according to the detected sub bias current ISbias.

A level of the third driving voltage (Vldo) may be lower than a level of the second driving voltage (Vbat) of both the example of FIGS. 1 and 2 and the example of FIGS. 3 and 4. Since the level of the third driving voltage (Vldo) is lower than the level of the second driving voltage (Vbat), a level of the sub bias current ISbias generated based on the third driving voltage (Vldo) may be lower than a level of the bias current Ibias generated based on the second driving voltage (Vbat).

Since the level of the sub bias current ISbias is lower than the level of the bias current Ibias, a voltage drop of the third driving voltage (Vldo) of the example of FIGS. 3 and 4 caused by the sub bias current ISbias flowing through the detection resistor Rsen may be lower than a voltage drop of the second driving voltage (Vbat) of the example of FIGS. 1 and 2 caused by the bias current Ibias flowing through the detection resistor Rsen. Accordingly, the power amplifier module 10 of the example of FIGS. 3 and 4 may have an improved amplification efficiency compared to the power amplifier module 10 of the example of FIGS. 1 and 2.

When the level of the sub bias current ISbias changes due to a change in a load impedance connected to the output terminal OUT, the level of the bias current Ibias also changes in a similar manner. Therefore, when changes in the sub bias current ISbias are detected, the similar changes in the bias current Ibias are also effectively detected.

Referring to FIG. 4, the control unit 200 includes a detection voltage output unit 210, a current level determination unit 220, and a control current generation unit 230.

The detection voltage output unit 210 may include a detection resistor Rsen disposed in a path of the sub bias current ISbias. The detection resistor Rsen may be disconnected between the third driving voltage (Vldo) terminal and the collector of the sub bias transistor SBTR.

When the sub bias transistor SBTR is turned on, the sub bias current ISbias flows from the third driving voltage (Vldo) terminal through the detection resistor Rsen to the collector of the sub bias transistor SBTR, thereby generating a detection voltage Vsen between the two ends of the detection resistor Rsen.

The detection voltage output unit 210 may output the detection voltage Vsen generated between the two ends of the detection resistor Rsen by the sub bias current ISbias flowing through the detection resistor Rsen.

The current level determination unit 220 may determine the level of the sub bias current ISbias according to the detection voltage Vsen. For example, the current level determination unit 220 may store data including levels of the detection voltage Vsen and corresponding levels of the sub bias current ISbias, and may determine the level of the sub bias current ISbias corresponding to the level of the detection voltage Vsen by referring to the data. For example, the current level determination unit 220 may include a look-up table storing the data, and may determine the level of the sub bias current ISbias corresponding to the level of the detection voltage Vsen by applying the detection voltage Vsen to the look-up table and retrieving the corresponding level of the sub bias current ISbias.

The control current generation unit 230 may generate a control current Icon according to the level of the sub bias current ISbias determined by the current level determination unit 220. For example, the control current generation unit 230 may vary the level of the control current Icon in response to a change in the level of the sub bias current ISbias. According to the control current Icon generated by the control current generation unit 230, the bias current Ibias and the sub bias current ISbias may be changed to limit the output of the power amplifier 100.

The examples described above makes it is possible to prevent burnout of a field-effect transistor constituting an antenna switch by limiting an output of a power amplifier according to the detected bias current.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier module comprising:
a power amplifier comprising:
an amplifying unit comprising an amplifying transistor configured to amplify an input signal and output an output signal, and
a bias unit comprising:
a bias transistor configured to provide a bias current to the amplifying transistor, and
a sub bias transistor configured to provide a sub bias current to the amplifying transistor; and
a control unit configured to provide a control current to the bias transistor and the sub bias transistor,
wherein the control unit is further configured to vary the control current according to the sub bias current, and
a level of the sub bias current is lower than a level of the bias current.

2. The power amplifier module of claim 1, wherein the control unit comprises a detection voltage output unit comprising a detection resistor disposed in a path of the sub bias current so that the sub bias current flows through the detection resistor and generates a detection voltage between two ends of the detection resistor, and
the detection voltage output unit is configured to output the detection voltage generated between the two ends of the detection resistor.

3. The power amplifier module of claim 2, wherein the detection resistor is connected between the sub bias transistor and a driving voltage terminal configured to provide a driving voltage to the sub bias transistor.

4. The power amplifier module of claim 2, wherein the control unit further comprises a current level determination unit configured to determine the level of the sub bias current according to a level of the detection voltage.

5. The power amplifier module of claim 4, wherein the current level determination unit stores data comprising levels of the detection voltage and corresponding levels of the sub bias current, and is further configured to determine the level of the sub bias current corresponding to the level of the detection voltage by referring to the data.

6. The power amplifier module of claim 4, wherein the control unit further comprises a control current generation unit configured to generate the control current according to the level of the sub bias current.

7. The power amplifier module of claim 1, wherein the bias unit comprises a diode configured to generate a temperature compensation voltage according to the control current.

8. The power amplifier module of claim 7, wherein the diode comprises a diode-connected transistor comprising a collector and a base connected to each other.

9. A power amplifier module comprising:
a power amplifier comprising:
an amplifying unit comprising an amplifying transistor configured to amplify an input signal and output an output signal, and
a bias unit comprising:
a bias transistor configured to receive a first driving voltage and provide a bias current to the amplifying transistor, and
a sub bias transistor configured to receive a second driving voltage and provide a sub bias current to the amplifying transistor; and
a control unit configured to provide a control current to the bias transistor and the sub bias transistor,
wherein the control unit is further configured to vary the control current according to the sub bias current, and
a level of the second driving voltage provided to the sub bias transistor is lower than a level of the first driving voltage provided to the bias transistor.

10. The power amplifier module of claim 9, wherein the control unit comprises a detection voltage output unit comprising a detection resistor disposed in a path of the sub bias current so that the sub bias current flows through the detection resistor and generates a detection voltage between two ends of the detection resistor, and
the detection voltage output unit is configured to output the detection voltage generated between the two ends of the detection resistor.

11. The power amplifier module of claim 10, wherein the detection resistor is connected between the sub bias transistor and a second driving voltage terminal configured to provide the second driving voltage to the sub bias transistor.

12. The power amplifier module of claim 10, wherein the control unit further comprises a current level determination unit configured to determine the level of the sub bias current according to a level of the detection voltage.

13. The power amplifier module of claim 12, wherein the current level determination unit stores data comprising levels of the detection voltage and corresponding levels of the sub bias current, and is further configured to determine the level of the sub bias current corresponding to the level of the detection voltage by referring to the data.

14. The power amplifier module of claim 12, wherein the control unit further comprises a control current generation unit configured to generate the control current according to the level of the sub bias current.

15. The power amplifier module of claim 9, wherein the bias unit comprises a diode configured to generate a temperature compensation voltage according to the control current.

16. The power amplifier module of claim 15, wherein the diode comprises a diode-connected transistor comprising a collector and a base connected to each other.

* * * * *